United States Patent [19]

Battail

[11] Patent Number: 5,268,686
[45] Date of Patent: Dec. 7, 1993

[54] DATA COMPRESSION METHOD

[75] Inventor: Gérard Battail, Paris, France

[73] Assignee: French State represented by Minister of the Post, Telecommunications & Space (Centre National d'Etudes des Telecommunications), Issy-les-Moulineaux, France

[21] Appl. No.: 641,734

[22] Filed: Jan. 15, 1991

[30] Foreign Application Priority Data

Jan. 15, 1990 [FR] France ................................ 90 00394

[51] Int. Cl.$^5$ ........................ H03M 7/30; H03M 7/26
[52] U.S. Cl. .................................... 341/107; 341/51; 341/79; 341/109
[58] Field of Search .................... 341/107, 50, 51, 79, 341/109

[56] References Cited

U.S. PATENT DOCUMENTS 4,488,143  12/1984  Martin ................................... 341/59
4,899,149   2/1990  Kahan ............................. 341/107 X

OTHER PUBLICATIONS

"A General Minimum-Redundancy Source-Coding Algorithm" by Mauro Guazzo, IEEE Transactions on Information Theory, vol. IT-26, No. 1, Jan., 1980, pp. 15-24.

*Primary Examiner*—Sharon D. Logan
*Attorney, Agent, or Firm*—Lowe, Price, LeBlanc & Becker

[57] ABSTRACT

The method is founded on the GUAZZO algorithm and is adaptive as it does not require any prior statistical knowledge of source of message to be coded. The message is comprised of a sequence of symbols of the source which are represented by the indication of the direction "0" or "1" chosen at each node of a binary tree. According to the invention, the adaptiveness is obtained by associating with each node two finite-sized counters that count the "0"s and "1"s according to the routing of the tree. The contents of these counters enable the conditional probability of each of the elements "0" and "1" to be estimated at the node.

8 Claims, 4 Drawing Sheets

DATA COMPRESSION METHOD

BACKGROUND OF THE INVENTION

This invention relates to an adaptive data compression method and the corresponding encoder and decoder.

The expression "data compression" here means a means of replacing a digital message by as short a message as possible from which the initial message can be retrieved exactly. The operation of transformation of the original message is called source encoding, in the information theory sense, and the opposite transformation which retrieves this message is called decoding.

The method is adaptive in that it does not require any prior statistical knowledge of the source of the message to be coded. In fact, there are numerous practical situations in which this knowledge is partial or even absent. For instance, a data file does not usually correspond to any statistical structure known a priori.

The method embodying the invention is of the type described by GUAZZO in the article entitled "A General Minimum-Redundancy Source-Coding Algorithm" published in the IEEE Transactions on Information Theory, volume IT-26, number Jan. 1, 1980, pages 15 to 25, for a source of which the probabilities are known and stationary.

OBJECT OF THE INVENTION

The main object of this invention is to make the algorithm of such a method both adaptive and easily achievable. The only operations that need be carried out are additions, comparisons or shiftings, the result of all the others being obtained by reading tables.

SUMMARY OF THE INVENTION

Accordingly, there is provided a data compression method wherein symbols of an original source to be encoded each are replaced by a sequence of binary elements deducted from their representation by a binary tree at the ends of which are associated said symbols of the source. The binary elements are interpreted in a first logic state as an order to turn left for certain elements and in a second logic state as an order to turn right for other elements. The sequence indicates the routing to be followed from the origin of the tree to reach that of the ends of the tree that corresponds to said symbol of the source. The sequence of binary elements thus associated with a sequence of symbols transmitted by the original source, which is equivalent to it, is interpreted as generated by an auxiliary binary source.

An encoding of each of the elements of said auxiliary binary source consists, since a predetermined integer m of sequences is available for coding, in splitting the set of these available sequences in such a way that the transmission of any one of $m_0$ first sequences represents an element in the first state whereas the transmission of any one of the $m_1 = m - m_0$ remaining sequences represents an element in the second state. $m_0$ is an integer chosen such that the ratio $m_0/m$ constitutes a satisfactory approximation, in the sense of a predetermined approximation criterion, of an available estimation p of the probability of the element in the first state conditionally at the node reached in the tree. A provisional encoded sequence is designated by the smallest number of sequences in the set to which it belongs, i.e., 0 for the element in the first state and $m_0$ for the element in the second state. The total number m of the available sequences for encoding of a subsequent binary element becomes $s2^n$, where s denotes the provision of available sequences for continuing the encoding, i.e., $s = m_0$ if the previous binary element is in the first state, and $s = m_1$ if the previous binary element is in the second state, n being an integer chosen for the approximation criterion in order for said encoding to be able to be satisfactory.

The number of the provisional sequence designated by the encoding is added to the previous provisional result multiplied beforehand by $2^n$.

According the method embodying the invention, each node of the tree is associated with two counters initiated at 1 and respectively counting the elements in the first and second states from the auxiliary source associated with the tree, said binary elements concerning tree branchings stemming from said node. When any one of said two counters associated with a node reaches a maximum size, the contents $c_0$, $c_1$ of both counters are reduced by dividing them by a same factor, to within an integral approximation. $p = c_0/(c_0 + c_1)$ designates the current estimation of the probability of the element in the first state of the auxiliary source, provided the corresponding node has been reached.

BRIEF DESCRIPTION OF THE DRAWINGS

Further features and advantages of the invention will be apparent from the following particular description of several preferred embodiments of this invention as illustrated in the corresponding accompanying drawings in which.

DESCRIPTION OF THE PREFERRED EMBODIMENTS

Figure 1:
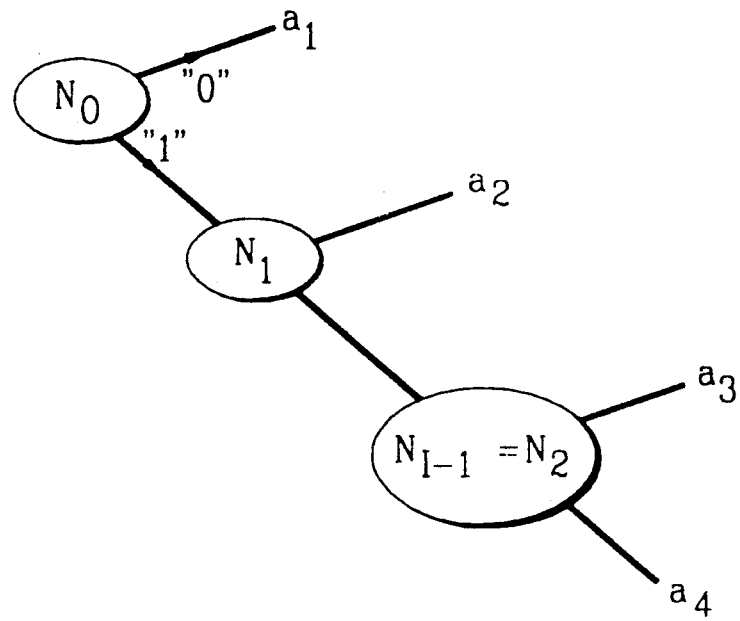
FIG. 1 is a diagram showing a binary tree with three nodes and four leaves.

Like the one described by GUAZZO, the method embodying the invention comprises a description of a message to be coded by means of a binary tree. Irrespective of the alphabet of the primary source transmitting this message, the source symbols are represented by the indication of the routing to be followed in the binary tree, from the origin $N_o$, also called root, to any one of the tree ends, called leaves. Each leaf is associated with the respective one of the symbols of the alphabet of the source. FIG. 1 shows such a binary tree for a quaternary source of which the primary symbols are noted $a_1$, $a_2$, $a_3$ and $a_4$. It shall be agreed that the indication "take the left branching" is associated with the binary element $b = $ "0" in a first logic state, and that the indication "take the right branching" is associated with the binary element $b = $ "1" in a second logic state.

Figure 2:
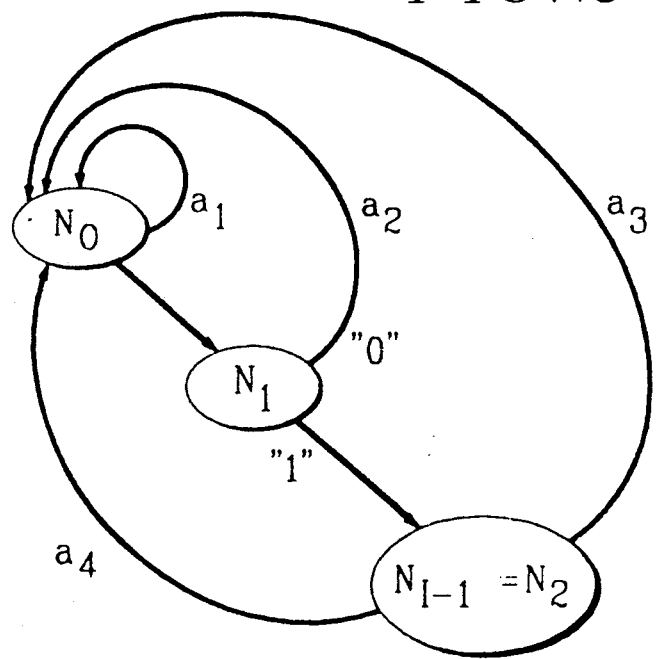
FIG. 2 is a diagram similar to that of FIG. 1, called transitions diagram, in which the leaves are merged with the root of the tree.

Furthermore, the tree representation is transformed by having the leaves merge with the root, the indication of the symbol $a_1$ to $a_4$ of the source being borne by each of the branchings leading to the root $N_o$, as per FIG. 2.

The diagram thus obtained is called a transitions diagram. Then, the message transmitted by the source is entirely equivalent to the sequence of "turn left" or "turn right" orders describing in this diagram the routing corresponding to the succession of symbols of this message. The binary representation of the sequence of these orders constitutes an auxiliary source, also called secondary source equivalent to the original source.

Moreover, in each of the $I=3$ nodes $N_o$ to $N_{I-1}=N_2$ of the tree, the representation of the binary elements "0" and "1" consists in splitting into two parts a certain set of available binary sequences, called "sequences" according to GUAZZO. The integral number of these binary sequences for this current node $N_i$ is noted m, where the index i lies between 0 and I-1. Belonging to the $m_o$ first of these m sequences, numbered 0 to $m_o$-1, serves to designate the symbol "0" of the auxiliary source, whereas belonging to the $m_1 = m - m_o$ remaining sequences, numbered from $m_0$ to m-1, designates the element "1" of the auxiliary source.

The representation of the binary message of the auxiliary source is shown to have reached its maximum concision if, and only if, at each of the nodes of the tree, there is equality between the ratio $m_o/m$ of the number of available sequences to represent the binary element "0" with regard to the total number of available sequences, and the probability of the route going through the branching associated with this binary element, i.e. the left branching, provided this node is reached.

A good approximation of optimum concision is obtained if this ratio $m_o/m$ is near this probability p in the sense of a predetermined approximation criterion ensuring a minimal performance.

Figure 3:
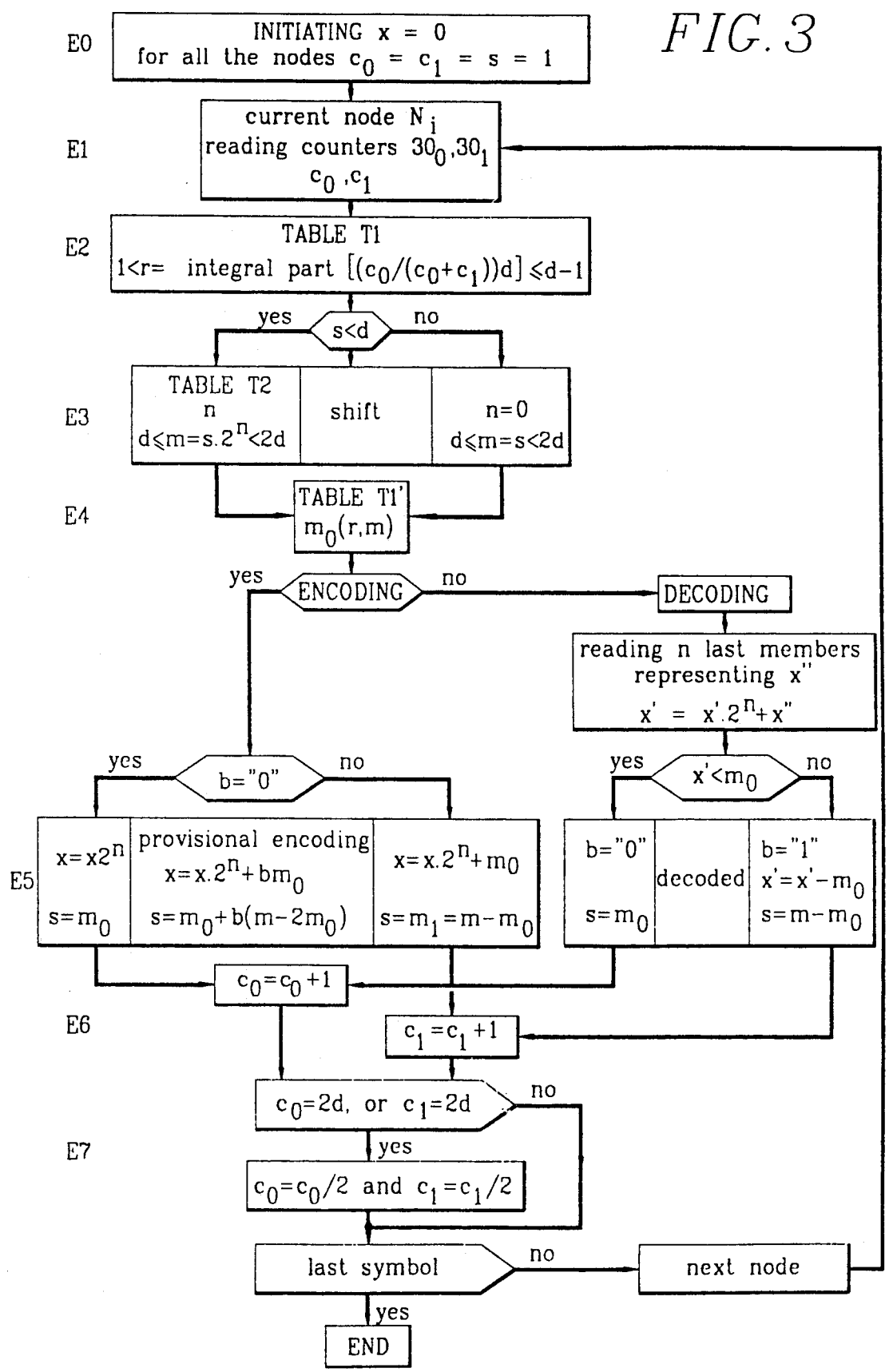
FIG. 3 represents a coding-decoding algorithm, and particularly of the processing of a tree node, for the data compression method embodying the invention.

The algorithm of FIG. 3 is now referred to in order to provide a detailed description of the various calculation steps of the provisional result of the encoding of a primary symbol corresponding to a current node of the tree.

At each of the nodes of the transitions diagram in FIG. 2, called current node, the conditional probabilities of the elements "0" and "1" are determined by a pair of counters of which one counts the "0" elements and the other counts the "1" elements. In designating the respective contents of these counters by $c_o$ and $c_1$, $p = c_o/(c_o + c_1)$ constitutes an estimation of the conditional probability of the element "0" at the current node.

Both the preservation of a finite size of the counters and the adaptation to a variation of the probabilities are ensured by simultaneously reducing by a same factor f, supposed equal to 2 throughout the sequence, the contents of the two counters associated with a node when just one of the two counters reaches a predetermined integral value 2d. At an initiating step E0 of the encoding of the message, the initial content of the counters must be equal to at least 1 to avoid the estimation of a probability being equal to 0 or 1, which would prevent the encoding from continuing. According to FIG. 3, the counts are initially $c_o = 1$ and $c_1 = 1$. For the same reason, division by 2 of an odd-numbered content must be taken as rounded up to the nearest integer. In the sequence, the counters are supposed either all of the same size, in which case their maximum size is equal to 2d, d being their content after the reduction which avoids them saturating, as indicated in the last step E7 of calculation for the second current node in FIG. 3, or of a size that decreases by a factor $\frac{1}{2}$ per branching as a function of the depth in the tree, 2d then being the maximum size of the counters associated the origin $N_O$ of the tree and, more generally, $(d/2^{i-1})$ being the maximum size for a node $N_i$ that is separated by i branchings from the origin $N_O$, the index i being an integer lying between 0 and I-1.

An initial number of binary sequences is taken which, if the alphabet used for encoding is binary, as has been supposed up to here, is in the form of $m = 2^n$, where n is an integer such that an integer mo can be found and for which $m_o/m$ is an approximation of p satisfying said predetermined criterion for the initial node $N_o$ of the transitions diagram. The encoded binary sequences are designated by a number x from 0 to m-1, taken provisionally equal to 0 if the first binary element of the auxiliary source is "0", and equal to $m_o$ if this first element is "1" (step E5 for $N_o$). To continue the encoding, I then have a provision of s possible binary sequences, with $s = m_o$ if the first binary element at the node $N_o$ is "0", and $s = m_1 = m - m_o$ if this first element is "1". At the second node $N_1$ of the route travelled in the transitions diagram, the total number of available binary sequences is $m = s \cdot 2^n$, where n is an integer determined as a function of the same criterion as before, and p now denotes the conditional probability of "0" at the node of $N_1$. A new value of $m_o$ (steps E3, E4) corresponds to this probability. The result of the provisional encoding is $x2^n$ if the element chosen at the second node is "0", and $(x2^n) + m_o$ if the element chosen is "1", where x designates the result of the provisional encoding for the node preceding the current node $N_1$, in this case $x = m_o$ for the node $N_O$ (step E5). This process of steps E1 to E7 is repeated at all the nodes encountered in route in the transitions diagram specified by the message.

The estimated probabilities p are approximated in the rational form r/d, where the integer d has been defined herein above and where r is any integer from 1 to d-1, this condition defining said predetermined approximation criterion. The performances of the algorithm embodying the invention, which depend solely on the accuracy of the approximation of the probability, are therefore exclusively a function of the parameter d. This parameter determines both the accuracy with which the probability is estimated in a stationary context, and the accuracy of the approximation of this probability by $m_o/m$.

Furthermore, the respective number n of binary elements that must be added at each node and that results from the multiplicative factor $2^n$ of the previous provisional encoding result x, is chosen such that $d \leq m < 2d$.

Two two-dimensional tables T1 and T1' are advantageously used for the following operations:

a) Table T1: determination of the number r that defines the approximation of the conditional probability as a function of the contents $c_o$ and $c_1$ of the counters associated with each of the nodes:

$1 \leq r = $ integral part $[(c_o/(c_o+c_1))d]$ to within $\pm 0.5 \leq (d-1)$;

b) Table T1': determination of the number $m_o$ associated with a given number m for $m_o/m$ to be a satisfactory approximation of p. It is simply the value of $c_o$ in this table such that, for the entries $c_o$ and $c_1 = m - m_o$, the number r associated with p can be read there.

The result of the operation a) is obtained by reading directly in table T1 (step E2), of which an example is given below for d=8. For the result of the operation b), the double inequality satisfied by m, i.e., $d \leq m < 2d$, entails the existence of at least one value equal to r in table T1, though there may exist two such values. To avoid all ambiguity, the simplest thing to do is to rearrange the table in such a way that it gives a value of mo as a function of r associated with p and of m, for values that can be taken by the parameter m, i.e,. included between d and 2d-1. An example of this table T1' is also provided below.

Prior to operation b), an auxiliary table T2 can be advantageously used for determining the values of n and consequently the values of m as a function of the available provision s if the latter is below d, i.e., $s < d$ and $d \leq m = s.2^n < 2d$. An example of table T2 is given hereinunder, again for d=8.

TABLE 1

| $c_1$ | \multicolumn{15}{c}{$c_0$} |
|---|---|---|---|---|---|---|---|---|---|---|---|---|---|---|---|
|  | 1 | 2 | 3 | 4 | 5 | 6 | 7 | 8 | 9 | 10 | 11 | 12 | 13 | 14 | 15 |
| 1 | 4 | 5 | 6 | 6 | 7 | 7 | 7 | 7 | 7 | 7 | 7 | 7 | 7 | 7 | 7 |
| 2 | 3 | 4 | 5 | 5 | 6 | 6 | 6 | 6 | 7 | 7 | 7 | 7 | 7 | 7 | 7 |
| 3 | 2 | 3 | 4 | 5 | 5 | 5 | 6 | 6 | 6 | 6 | 6 | 6 | 6 | 7 | 7 |
| 4 | 2 | 3 | 3 | 4 | 4 | 5 | 5 | 5 | 6 | 6 | 6 | 6 | 6 | 6 | 6 |
| 5 | 1 | 2 | 3 | 4 | 4 | 4 | 5 | 5 | 5 | 5 | 6 | 6 | 6 | 6 | 6 |
| 6 | 1 | 2 | 3 | 3 | 4 | 4 | 4 | 5 | 5 | 5 | 5 | 5 | 5 | 6 | 6 |
| 7 | 1 | 2 | 2 | 3 | 3 | 4 | 4 | 4 | 4 | 5 | 5 | 5 | 5 | 5 | 5 |
| 8 | 1 | 2 | 2 | 3 | 3 | 3 | 4 | 4 | 4 | 4 | 5 | 5 | 5 | 5 | 5 |
| 9 | 1 | 1 | 2 | 2 | 3 | 3 | 4 | 4 | 4 | 4 | 4 | 5 | 5 | 5 | 5 |
| 10 | 1 | 1 | 2 | 2 | 3 | 3 | 3 | 4 | 4 | 4 | 4 | 4 | 5 | 5 | 5 |
| 11 | 1 | 1 | 2 | 2 | 3 | 3 | 3 | 3 | 4 | 4 | 4 | 4 | 4 | 4 | 5 |
| 12 | 1 | 1 | 2 | 2 | 2 | 3 | 3 | 3 | 3 | 4 | 4 | 4 | 4 | 4 | 4 |
| 13 | 1 | 1 | 2 | 2 | 2 | 3 | 3 | 3 | 3 | 3 | 4 | 4 | 4 | 4 | 4 |
| 14 | 1 | 1 | 1 | 2 | 2 | 2 | 3 | 3 | 3 | 3 | 4 | 4 | 4 | 4 | 4 |
| 15 | 1 | 1 | 1 | 2 | 2 | 2 | 3 | 3 | 3 | 3 | 3 | 4 | 4 | 4 | 4 |

Table T1' gives the values of $m_o$ as a function of values of r in the first line and of values of m in the left-hand column.

TABLE T1'

|    | 1 | 2 | 3 | 4 | 5 | 6 | 7 |
|----|---|---|---|---|---|---|---|
| 8  | 1 | 2 | 3 | 4 | 5 | 6 | 7 |
| 9  | 1 | 2 | 3 | 4 | 6 | 7 | 8 |
| 10 | 1 | 2 | 4 | 5 | 6 | 8 | 9 |
| 11 | 1 | 3 | 4 | 5 | 7 | 8 | 10 |
| 12 | 1 | 3 | 4 | 6 | 8 | 9 | 11 |
| 13 | 1 | 3 | 5 | 6 | 8 | 10 | 12 |
| 14 | 1 | 3 | 5 | 7 | 9 | 11 | 13 |
| 15 | 1 | 3 | 5 | 7 | 10 | 12 | 14 |

In Table T2, the first line contains the values of s, the second those of n and the third those of m.

TABLE T2

| s | 1 | 2 | 3 | 4 | 5 | 6 | 7 |
|---|---|---|---|---|---|---|---|
| n | 3 | 2 | 2 | 1 | 1 | 1 | 1 |
| m | 8 | 8 | 12 | 8 | 10 | 12 | 14 |

The number engendered by the algorithm in FIG. 3 is only limited by the size of the message to be encoded. It is desirable for the binary representation of the message not to exceed a predetermined number of binary elements. To do so, the finite sequence of binary elements b comprising the message transmitted by the auxiliary source is regularly cut up into blocks having N binary elements each, where N is a predetermined integer. Each block is easily determined by finding the sum of all the shift numbers n successively calculated by the encoding algorithm. As soon as this sum exceeds the number N, the encoding is interrupted, its provisional result is completed to N figures with "0"s if necessary, and is transmitted in the form of a block. The coding is reinitiated, with the exception of counters associated with the nodes that preserve their content. Finally, the usable message is completed by as many "0"s as necessary for the last block of encoded elements transmitted to have a length N.

The coding thus carried out is not exactly irreducible in that the prefix condition is not satisfied, but knowledge of the numbers m and $m_o$ at the first stage enable the element "0" or "1" to be determined there. Then, by subtracting $m_o$ from the number received if this symbol is equal to "1", the operation can then be repeated at the following node for which the new values of m and $m_o$ are also known, etc. The code thus devised is consequently decipherable.

Decoding uses knowledge of the tree, of the estimation of the conditional probabilities of its branchings, and of application rules of the criterion that is used to determine m. As will be seen hereinafter, in order to take adaptiveness into account, the decoder is fitted with the same counters as the encoder and the frequencies of the branchings at the different nodes are determined there in the same way. The coded message must be received from its start on, and the updating of the measured frequencies must be carried out subsequent to the encoding.

In FIG. 3, at step E5, the provisional result of the encoding is designated by x and the final result is therefore x when the end of the algorithm is reached.

Similarly for decoding, x' designates the encoded message received and transformed by the decoder. The message is read in groups of n binary elements each representing the number x". We supposed the a priori probabilities of the source to be unknown. The transitions diagram is deduced from the natural binary tree or from another well-defined tree, e.g. the Huffman tree for the supposed probabilities.

Figure 4:
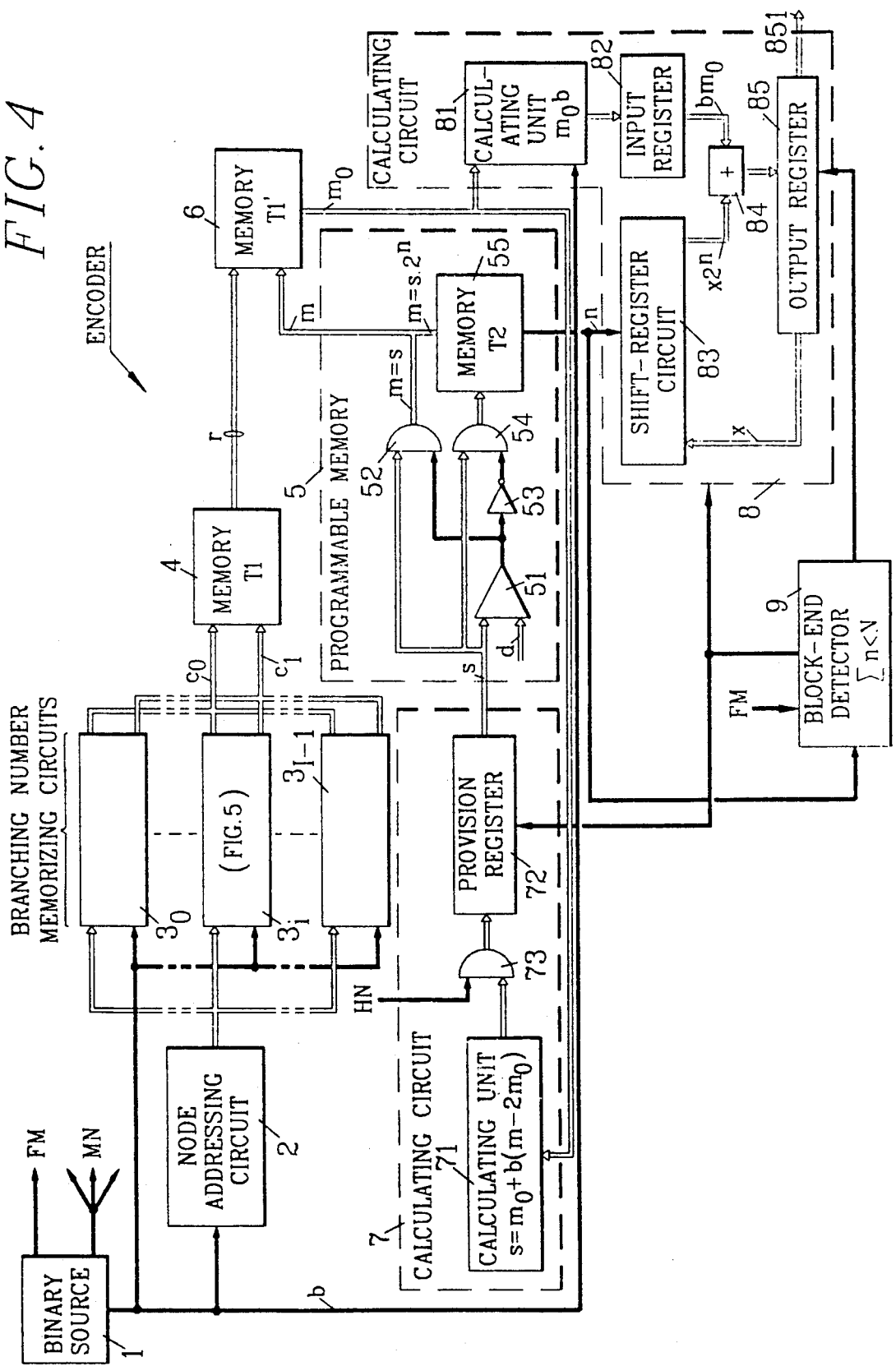
FIG. 4 is a schematic block-diagram of a preferred embodiment of an encoder embodying the invention.

In reference now to FIG. 4, it is supposed that an encoder embodying the invention works on the basis of the natural binary tree, i.e., in which each of the elements of the binary representation of a primary symbol of the source can be interpreted as indicating at each node whether the route leading to the leaf associated with this symbol takes the left branching ("0") or the right branching ("1"). The origin or root $N_O$ of this tree thus corresponds to the most significant element of the representation of the symbol. The sequence of binary elements thus corresponding to the sequence of symbols successively transmitted by the source will be interpreted hereinafter as transmitted by an auxiliary binary source 1. The binary elements b are transmitted by the source together with various clock signals, such as a signal HN at the frequency of the incoming binary bits or elements b and consequently of the processing of the nodes in the tree, and a signal FM signalling the end of each message. The clock signal HN is applied to all the circuits 2 to 9 of the encoder.

At input, the encoder comprises a node addressing circuit 2 for translating the progression in the tree as a function of the binary elements of the auxiliary source 1. There is return to the root $N_O$ when a terminal node or leaf is reached. At each period of the clock signal HN, a well-defined node is reached and is called "current node".

Figure 5:
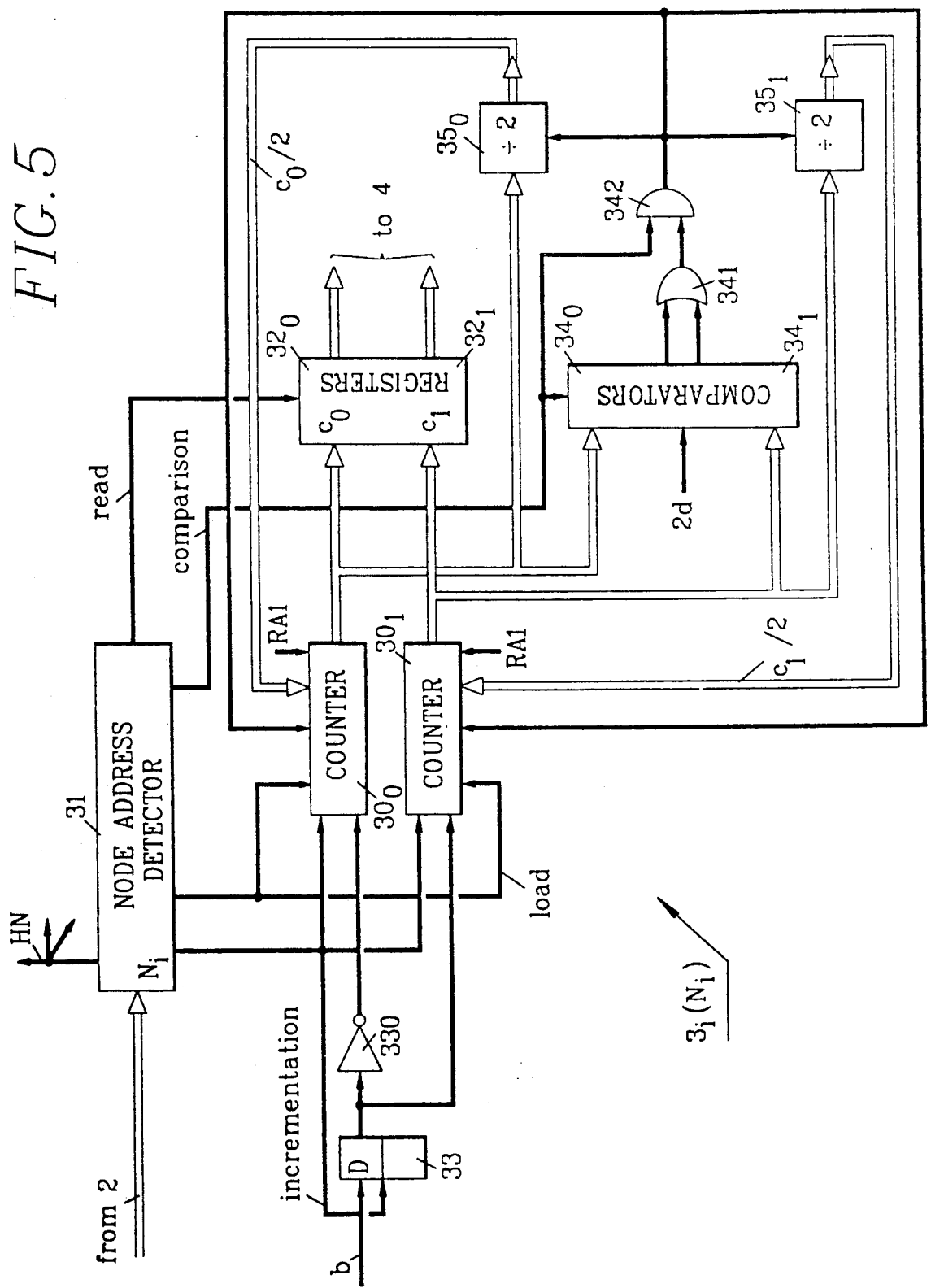
FIG. 5 is a block-diagram of a circuit for memorizing numbers of branchings counted in a node, included in the encoder of FIG. 4.

The addressing circuit 2 transmits via an output bus the addresses of the nodes that are gradually crossed in the binary tree, to branching number memorizing circuits $3_0$ to $3_{I-1}$ respectively associated with the nodes $N_O$ to $N_{I-1}$ of the tree. One, $3_i$, of these memorizing circuits is shown in detail in FIG. 5, the index i lying between 0 and I-1.

The circuit $3_i$ is structured around two counters $30_0$ and $30_1$ indicating the counts $c_0$ and $c_1$ associated with the node $N_i$ and used in steps E1, E6 and E7 of the algorithm shown in FIG. 3. The counters are used to estimate the frequency of the binary elements indicating the left or right direction to be taken from the node $N_i$. The steps E1, E6 and E7 are controlled by a detector 31 detecting the address of the node $N_i$ that is connected to the addressing bus outgoing from the addressing circuit 2 and which plays the role of local time base. This time base, as well as the other logic circuits included in the memorizing circuit $3_i$, are clocked by the clock signal HN.

At the beginning of the processing of the node $N_i$ corresponding to the step E1, the counts $c_0$ and $c_1$ are respectively read in two output registers $32_0$ and $32_1$ connected to a double addressing bus of a table memory 4, as will be seen hereinunder. The counts $c_0$ and $o_1$ are the ones that were calculated during the previous processing of the node $N_i$.

Then an input D flip-flop 33 receiving the binary element b is clocked by the detector 31 so as to distinguish a binary element "1" from a binary element "0". The output of the flip-flop 33 is directly connected to a counting input of the counter $30_1$ and via an inverter 330 to the counting input of the counter $30_0$ in such a way that the counters $30_0$ and $30_1$ are incremented by one unity in response to a binary element b="0", and to a binary element b="1" respectively, as indicated in step E6.

Step E7 is triggered by the detector 31, by actuating two digital comparators $34_0$ and $34_1$. The inputs of these comparators as well as those of two digital divide-by-two dividers $35_0$ and $35_1$ are respectively connected to the output bus of the counters $30_0$ and $30_1$. The comparators $34_0$ and $34_1$ compare the counts $c_0$ and $c_1$ calculated in step E6 to the maximum value of 2d-1, where d is the integral parameter that specifies the accuracy of the estimation of the conditional probabilities of the branchings at each node. The outputs of the comparators $34_0$ and $34_1$ jointly control actuation inputs of the dividers $35_0$ and $35_1$ via a two-input OR gate 341 and a two-input AND gate 342 opened by the detector 31. When one of the counts $c_0$ and $c_1$ reaches the value 2d, one of the comparators $34_0$ and $34_1$ applies a "1" to the actuation inputs of the dividers $35_0$ and $35_1$. The results of the divisions $c_0/2$ and $c_1/2$ are respectively loaded in the counters $30_0$ and $30_1$ under the control of the address detector 31 and of the output of the AND gate 342 at the end of step E7. The previous divisions are carried out with a rounded up integral approximation.

It should be noted that, at first, at the start of processing of a message, the counters $30_0$ and $30_1$ are set at "1" (RA1) by the source 1, as in step E0.

Again referring to FIG. 4, the encoder comprises three memories 4, 5 and 6 for memorizing the tables T1, T2 and T1' and for carrying out steps E2 to E4, a first calculating circuit 7 for calculating the provision s, and a second calculating circuit s for calculating the provisional coding result x.

At step E2, the contents of the counters $30_0$ and $30_1$ associated with the current node $N_i$ and respectively designated by $c_0$ and $c_1$ are used respectively as addresses for the column and line of the first table T1 memorized in the memory 4. In response to these two addresses, the number r, numerator of the best rational approximation of $p=c_0/(c_0+c_1)$ with d for denominator, is applied as column address in the table T1' memorized in the memory 6.

At the start of step E3, a provision memorizing register 72 is read so as to compare the previously memorized provision s with a threshold d in the memory 5, which is in the form of a programmable circuit. In the programmable memory 5, a digital comparator 51 actuates a first AND circuit 52 receiving the provision s in order for the latter to constitute a line address of the table T1' in the memory 6 when the number s is greater than d. Otherwise, the output of the comparator 51 actuates via an inverter 53 another AND circuit 54 to read the corresponding numbers n and m in a memory 55 containing the table T2 in response, as a reading address, to the number s in the register 72. The number $m=s.2^n$ is applied, as previously, as a line address to the memory 6, and the number n read in the memory 55 is applied to a shift-register circuit 83 included in the circuit 8, and to a block-end detector 9. When the number m has been determined, as equal to either s or $s.2^n$, as specified in step E3, the table T1' in the memory 6 is read as a function of the column and line reading addresses r and m in order to apply the corresponding number $m_0$ with the binary element b to calculating units 71 and 81 respectively included in the circuits 7 and 8.

In this way, after step E4, the calculating units 71 and 81 respectively calculate the number $s=m_0+b(m-2m_0)$ and the number $m_0 b$, as per step E5. The new value s derived by the unit 71 is inscribed in the register 72 via an AND writing circuit 73 clocked by the clock signal HN. The value $m_0 b$ thus calculated is inscribed in an input buffer register 82 of an accumulator included in the circuit 8. In this accumulator, the outputs of the register 82 as well as those of the shift-register circuit 83 are respectively connected to an adding circuit 84 which produces a sum $x.2^n+bm_0$ to be stored in an output buffer register 85 of the accumulator.

At the start of each node cycle, the content x of the register 85 is transferred in the first stages of the shift-register 83. At the end of step E3, the number n, which can be equal to zero when s is "more" than d, and which is read in the memory 55, is loaded in a shift-register controlling circuit included in the circuit 83 in order for the previously stored number x to be shifted left by a number of shift-register stages equal to the number n, so as to carry out the relative multiplication to the power of n, i.e., $x.2^n$. The n stages to the right in the register 83 corresponding to the least significant bits are then equal to "0". The new number x is read in the register 83 simultaneously to the reading of the number $m_0b$ in the register 82 so as to add them in the adder 84.

The block-end detector 9 carries out the operations described below, after the presentation of the table T2. The detector 9 adds the shift numbers n transmitted by the memory 55 when s>d, and compares the sum of these numbers n with the predetermined integer N. Once this sum exceeds N, the detector 9 commands block-end operations consisting in transferring the content of the output register 85 of the accumulator in an output bus 851 of the encoder. At each block-end, the registers 82, 83 and 85 of the accumulator are zeroized, simultaneously with the initial resetting of the provision register 72 to "1". In response to a message-end signal FM, the detector 9 completes the content of the register 85 with "0"s and commands the transmission of the last block of the message thus constituted having N elements. At the message end FM, the counters $30_0$ and $30_1$ in the branching number memorizing circuits $3_0$ to $3_{J-1}$ are reset to "1" (RA1).

According to other embodiments, the message is cut up into fixed-length blocks, to which different numbers of encoded symbols respectively correspond.

The decoder corresponding to the encoder shown in FIG. 4 has a similar structure. Instead of receiving the binary elements b, the decoder receives the binary elements of the message x, which are read in groups of n binary elements, respectively representing numbers x".

In the decoder, an accumulator input register is initially loaded by the received block, and the accumulator functions as a subtracter. The content of the accumulator input register is compared with the number $m_0$ shifted as indicated by the number n provided by the memory containing the table T2. If this content is less than the number $m_0$, the symbol of the auxiliary source is decoded with the value b="0". If said content is more than or equal to $m_0$, the symbol decoded is b="1". The number $m_0$ shifted as a function of the indication of the accumulated shift-register is subtracted from the content of the accumulator. When this content becomes nil, block-end is detected and the accumulator must be reloaded by a new block. The provision register is reset to its initial value "1".

What I claim is:

1. A data compression method wherein
   each symbol of an original source to be encoded is replaced by a sequence of binary elements deduced from a representation of the sequence of binary elements by a binary tree having ends associated with said symbols of said source,
   said binary elements being interpreted in a first logic state as an order to turn left for certain elements and in a second logic state as an order to turn right for other elements,
   said sequence indicating routing to be followed from an origin of said tree to ends of said tree corresponding to a symbol of said source,
   the sequence of binary elements thus associated with a sequence of symbols transmitted by said original source, which is equivalent to the sequence of symbols, being interpreted as being generated by an auxiliary binary source,
   said method comprising the steps of encoding each of said elements of said auxiliary binary source into a predetermined integral number (m) of sequences available for encoding,
   splitting a set of said available sequences in such a way that transmission of any one of $m_0$ first sequences represents an element in said first state and transmission of any one of the $m_1 = m-m_0$ remaining sequences represents an element in said second state, where $m_0$ is an integer such that the ratio $m_0/m$ defines a satisfactory approximation, in the sense of a predetermined approximation criterion, of an available estimation of the probability (p) of said element being in said first state conditionally at a node reached in said tree,
   designating a provisional encoded sequence by the smallest number of sequences in a set to which the provisional encoded sequence belongs so the element in said first state is designated by 0 and the element in said second state is designated by $m_0$,
   a total number m of said available sequences for encoding of a subsequent binary element being $s2^n$, where s is a provision of available sequences for continuing said encoding so $s=m_0$ if a previous binary element is in said first state and $s=m_1$ if said previous binary element is in said second state, where n is an integer chosen for an approximation criterion in order for said encoding to be satisfactory,
   multiplying beforehand by $2^n$ the number of said provisional sequence designated by said encoding as added to a previous provisional result,
   each node of said tree being associated with first and second counters having initial counts of 1,
   respectively counting in said first and second counters the elements in said first and second states from said auxiliary source associated with said tree, said binary elements concerning tree branchings stemming from said node, and
   in response to either of said first and second counters associated with a node reaching a maximum count, reducing the contents $c_0$, $c_1$ of said first and second counters by dividing them by a common factor, to within an integral approximation,
   where $c_0$, $c_1$ and p are related so $p=c_0/(c_0+c_1)$ is a current estimate of the probability of the element in said first state of said auxiliary source, provided the corresponding node has been reached.

2. The method of claim 1 wherein a reduction factor of said contents $c_0$ and $c_1$ of said first and second counters equals two and a corresponding node has been reached.

3. The method of claim 2 wherein the maximum count 2d of said first and second counters is the same for all nodes of said tree, where d is an integer.

4. The method of claim 2 wherein the maximum count of said first and second counters associated with said origin of said tree equals 2d, where d is an integer, and the maximum count of said first and second counters associated with a node separated from said origin by i branchings of said tree equals $d/2^{i-1}$, where i is an integer.

5. The method of claim 3 wherein an approximation of p is the nearest fraction to p in the form r/d, where r is any integer from 1 to d-1 and d is an integral count value of one of said counters associated with said origin of said tree, after said reduction which prevents the counter from saturating when the content of said counter has reached its maximum count of 2d.

6. The method of claim 5 wherein the values of r are read in a two-dimensional table as a function of the contents $c_0$ and $c_1$ of said counters.

7. The method of claim 5 further comprising determining an integer n such that $m=2^n s$ is the smallest integer greater than or equal to d, s being said provision or previously constituted sequences.

8. The method of claim 7 wherein the values of $m_0$ are read in a table as a function of said numbers r and m.

* * * * *